| | | |
|---|---|---|
| (12) | United States Patent<br>Hayashi | (10) Patent No.: US 11,171,252 B2<br>(45) Date of Patent: Nov. 9, 2021 |

(54) SOLAR PHOTOVOLTAIC MODULE

(71) Applicant: Susa Inc., Okayama (JP)

(72) Inventor: Yukinori Hayashi, Okayama (JP)

(73) Assignee: SUSA, INC., Okayama (JP)

( * ) Notice: Subject to any disclaimer, the term of this patent is extended or adjusted under 35 U.S.C. 154(b) by 85 days.

(21) Appl. No.: 16/441,470

(22) Filed: Jun. 14, 2019

(65) Prior Publication Data

US 2019/0386162 A1 Dec. 19, 2019

(30) Foreign Application Priority Data

Jun. 18, 2018 (JP) .............................. JP2018-115210

(51) Int. Cl.
*H01L 31/048* (2014.01)
*H01L 31/0216* (2014.01)

(52) U.S. Cl.
CPC .... *H01L 31/0488* (2013.01); *H01L 31/02164* (2013.01)

(58) Field of Classification Search
None
See application file for complete search history.

(56) References Cited

U.S. PATENT DOCUMENTS

2016/0142008 A1 * 5/2016 Lopez .................... H02S 40/36
                                                                    136/251

FOREIGN PATENT DOCUMENTS

| CN | 207603512 U | * | 7/2018 |
| JP | 2007264353 A | | 10/2007 |
| JP | 2008016227 A | | 1/2008 |
| JP | 2010062569 A | | 3/2010 |
| JP | 2010147110 A | | 7/2010 |

OTHER PUBLICATIONS

ON 207603512 eng trans (Year: 2018).*

* cited by examiner

*Primary Examiner* — Shannon M Gardner
(74) *Attorney, Agent, or Firm* — McCormick, Paulding & Huber PLLC (57) ABSTRACT

A module main body having a solar photovoltaic element is arranged on an inner surface side of a back cover, and a front cover is arranged on a front surface of the module main body. A light shielding filter is arranged in the front cover, and the light shielding filter shields light having a longer wavelength than a threshold wavelength of the solar photovoltaic element but transmits light having a shorter wavelength than the threshold wavelength toward the module main body or shields the infrared ray.

9 Claims, 8 Drawing Sheets

SOLAR PHOTOVOLTAIC MODULE

CROSS-REFERENCE TO RELATED APPLICATION

The present application claims priority from Japanese Patent Application No. 2018-115210 filed on Jun. 18, 2018, the content of which is hereby incorporated by reference into this application.

TECHNICAL FIELD

The present invention relates to a solar photovoltaic module that converts energy of solar light into electric power.

BACKGROUND

A solar photovoltaic module that converts energy of solar light into electric power is also called a solar panel or a solar photovoltaic panel. Regularly, the solar photovoltaic module includes: a back cover made of glass; a module main body made of a solar photovoltaic element arranged on a front side of the back cover; and a front cover made of glass that is layered on a light reception side of this module main body. The module main body having the solar photovoltaic element is arranged between two glasses.

A general solar photovoltaic element has a structure in which p-type and n-type semiconductors are bonded to each other so that electrons in the n-type semiconductor are excited when solar beam enters the structure and move into the p-type semiconductor. In this manner, electric conduction is formed in single direction, and the electrons diffuse over a bonding surface between both the semiconductors, so that a lot of free electrons are generated, and electric current is generated by the movement of the electrons.

In order to efficiently receive the solar light to increase a power-generation efficiency, in a solar power generation module, that is, a solar photovoltaic module described in Japanese Patent Application Laid-Open Publication No. 2010-62569, a module main body is arranged on a surface of a reflection member. In this manner, the solar beam is directly emitted to the module main body, and besides, is also emitted after the solar beam is reflected by the reflection member.

SUMMARY

The solar photovoltaic element generates power using photovoltaic effect that is generated by exciting electrons of a valence band to a conduction band because of optical energy, that is, using photoelectric effect. In order to excite the electrons to the conduction band, it is necessary to apply energy that is equal to or larger than a level of an energy band gap to the electrons. This means that it is necessary to emit light having the energy that is equal to or larger than the level of the energy band gap to the electrons. The level of the energy band gap depends on a property of a semiconductor configuring the solar photovoltaic element. Therefore, light having a shorter wavelength than a wavelength (referred to as power-generation threshold wavelength below) of light having an equivalent energy to the level of the energy band gap can be utilized for power generation of the solar photovoltaic element, but light having a longer wavelength than the power-generation threshold wavelength cannot be utilized for the power generation.

For example, in a case of a solar photovoltaic element using a crystalline-based silicon semiconductor, an energy band gap of the crystalline silicon is about 1.12 eV. A wavelength of light having almost the equivalent energy to the level of the energy band gap that is about 1.12 eV is about 1100 nm. Therefore, in the case of the solar photovoltaic element made of crystalline silicon, the power-generation threshold wavelength is about 1100 nm, and light having a shorter wavelength than about 1100 nm that is the power-generation threshold wavelength can be utilized for the power generation of a crystalline-based silicon solar photovoltaic cell.

However, the electrons that are excited by the light having the longer wavelength than about 1100 nm that is the power-generation threshold wavelength discharge the excessive energy as heat and are housed in the conduction band, and therefore, the energy discharged as the heat is not converted into electricity and is discarded.

Incidentally, it is known that a power-generation efficiency of the solar photovoltaic element is decreased by increase in a temperature. For example, it is known that, when the temperature of the solar photovoltaic element exceeds 60° C., the power-generation efficiency decreases by about 20%, and therefore, it is desirable to prevent the increase in the temperature of the solar photovoltaic module caused by the wavelength of the irradiation light. It is thought that the increase in the temperature of the solar photovoltaic module caused by the irradiation light is mainly caused by light having a longer wavelength than the threshold wavelength in the irradiation light to the solar photovoltaic element. The light having the longer wavelength than the threshold wavelength is not converted into the electricity but increases the temperature of the solar photovoltaic element.

Meanwhile, in order to increase the power-generation efficiency of the solar photovoltaic module, it is necessary to set a solar photovoltaic module, that is, a solar panel in a region that is reliably irradiated with solar light. However, it is difficult to obtain a large place where a lot of solar panels can be placed. Therefore, as described in the Patent Document 1, solar panels are placed on, for example, a roof of or a wall of a building or an upper surface of a vehicle. However, the solar panels cannot be easily placed on existing building or vehicle. Therefore, the solar panel has not been popular.

An object of the present invention is to provide the solar photovoltaic module that can suppress the increase in the temperature caused by the irradiation light.

Another object of the present invention is to provide a solar photovoltaic module that can be easily placed on an existing facility.

A solar photovoltaic module of the present invention, that is made of a module main body with a solar photovoltaic element and a front cover arranged on a front surface side of the module main body, includes: a module plate arranged along and on a cable; a first orientation holding plate that is mounted on one side of the module plate; and a second orientation holding plate that is mounted on the other side of the module plate and that holds the module main body upward while covering a lower side of the cable together with the first orientation holding plate.

The solar photovoltaic module has a light shielding filter that shields light having a longer wavelength than the threshold wavelength of the solar photovoltaic element, that is, a wavelength of light having the equivalent energy to the level of the energy band gap of the semiconductor configuring the solar photovoltaic element while allowing light having a shorter wavelength to penetrate the filter toward the module main body. Therefore, even if the solar photovoltaic module is irradiated with solar ray, the increase in the temperature of the module main body can be suppressed. And, the solar photovoltaic module of the present invention has the light shielding filter that shields the infrared ray. Therefore, even if the solar photovoltaic module is irradiated with the solar ray, the increase in the temperature of the module main body can be suppressed. Since the increase in the temperature of the module main body can be suppressed, endurance of the solar photovoltaic module can be improved.

DETAILED DESCRIPTION

Figure 1:
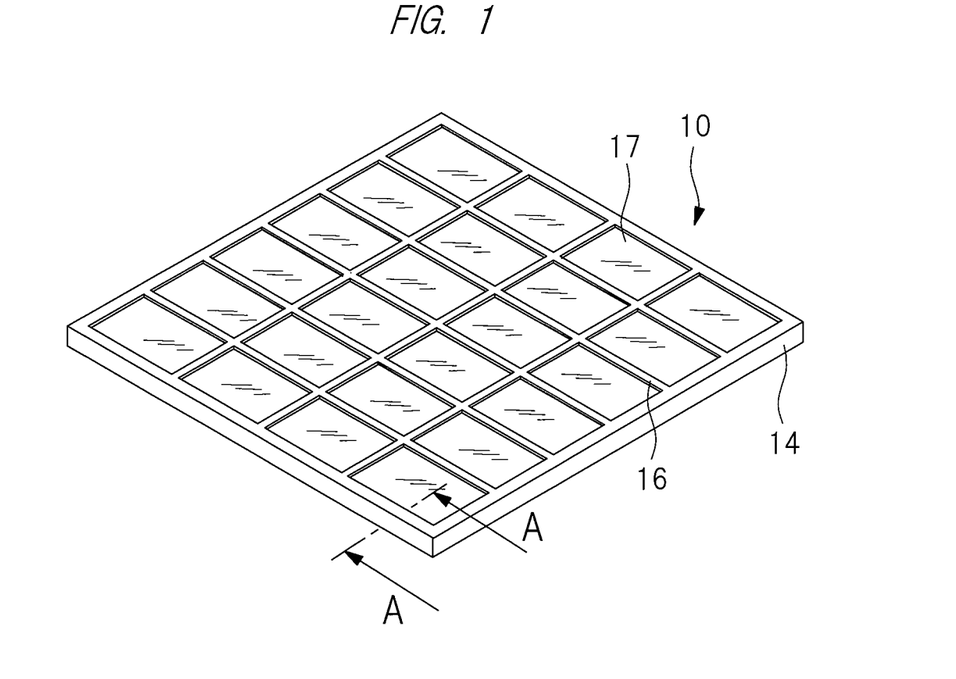
FIG. 1 is a perspective view showing one example of a solar photovoltaic module.
Figure 2:
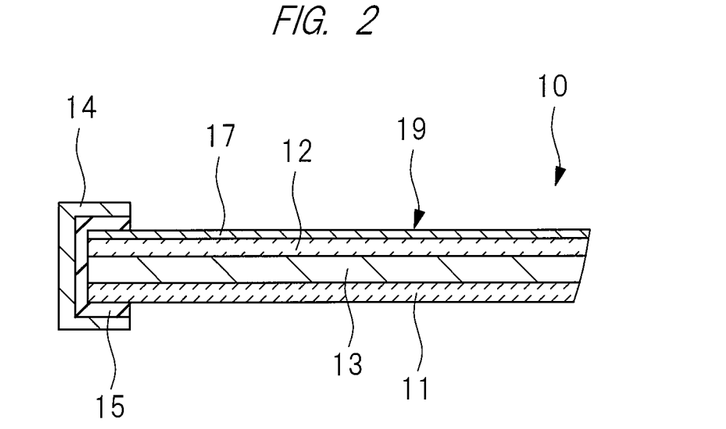
FIG. 2 is an enlarged cross-sectional view on a line A-A of FIG. 1.

Hereinafter, embodiments of the present invention will be described in detail on the basis of the accompanying drawings. As shown in FIGS. 1 and 2, a solar photovoltaic module 10 has a back cover 11 made of a resin, a reinforced glass, or others and a transparent front cover 12 made of a reinforced glass and irradiated with solar ray, and a module main body 13 is arranged between the back cover 11 and the front cover 12. The module main body 13 is arranged on an inner surface side of the back cover 11, and the front cover 12 is arranged on a front surface side of the module main body 13.

The module main body 13 includes a lot of solar photovoltaic elements, and any element can be used as the solar photovoltaic element as long as being an element that can directly convert the optical energy into the electric power. For example, a silicon-based solar photovoltaic element such as a monocrystalline silicon solar photovoltaic element, a polycrystalline silicon solar photovoltaic element, an amorphous silicon solar photovoltaic element, a microcrystalline silicon solar photovoltaic element and a spherical silicon solar photovoltaic element can be used. Alternatively, a chemical compound solar photovoltaic element such as a CIS-based solar photovoltaic element, a CSGS-based solar photovoltaic element and a GaAs-based solar photovoltaic element can be also used. Further, an organic film solar photovoltaic element, a multi-junction solar photovoltaic element or others can be also adopted. A solar photovoltaic element is manufactured by using a resin film as a base material, and the module main body 13 has a layer structure as a whole as shown in FIG. 2.

A frame 14 is attached to an outer circumference of the solar photovoltaic module 10, and a shielding member 15 is embedded inside the frame 14. Further, a reinforcing member 16 is attached in a lattice form on front and back surfaces of the solar photovoltaic module 10.

In order to increase the power-generation efficiency of the solar photovoltaic element, it is preferable to avoid the increase in the temperature of the module main body 13.

As described above, while the light having the shorter wavelength than the wavelength (referred to as power-generation threshold wavelength below) of the light having the equivalent energy to the level of the energy band gap can be utilized for the power generation of the solar photovoltaic element, the light having the longer wavelength than the power-generation threshold wavelength cannot be utilized for the power generation and increases the temperature of the module main body 13.

Accordingly, as shown in FIG. 2, the front cover 12 is provided with a light shielding filter 17. The light shielding filter 17 cannot be utilized for the power generation, and shields the light having the wavelength increasing the temperature of the module main body 13, that is, shields the light having the longer wavelength than the threshold wavelength so that the light having the wavelength does not reach the module main body 13. In the manner, the increase in the temperature of the module main body 13 can be suppressed, and the power-generation efficiency can be increased.

In order to increase the power-generation efficiency, a first mode that shields the light having the longer wavelength than the threshold wavelength by using the light shielding filter 17 as described above is applicable. As a second mode, the module main body is irradiated with the solar light having a wavelength of 800 nm or shorter while shielding the infrared ray. In this second mode, the infrared ray is shielded, and therefore, the increase in the temperature of the module main body 13 can be further suppressed. Further, as a third mode, the module main body 13 is irradiated with the solar light having a wavelength of 610 nm or shorter while shielding light having a wavelength of a red color or longer. As a fourth mode, the module main body 13 is irradiated with the solar light having a wavelength of 570 nm or shorter while shielding light having a wavelength of a yellow color or longer. In these modes, the increase in the temperature of the module main body 13 can be further suppressed. Still further, as a fifth mode, ultraviolet rays having wavelengths of 100 to 400 nm are shielded. In this mode, in addition to the suppression of the increase in the temperature of the module main body 13 caused by the ultraviolet ray, reduction in the endurance of the module main body 13 due to chemical change caused by the irradiation with the ultraviolet ray is suppressed. A short wavelength that is 315 nm or shorter in the ultraviolet rays is not effective for the power generation, and therefore, a mode of shielding the ultraviolet ray having this wavelength is also applicable. A mode of adding the above-described first to fourth modes to the fifth mode of shielding the ultraviolet ray is also applicable.

By using any of the first to fourth modes for the light shielding filter 17 shown in FIG. 2 as described above, the increase in the temperature of the module main body 13 can be suppressed, and the power-generation efficiency can be increased. In the fifth mode, the endurance of the module main body 13 can be improved. In FIG. 2, note that the light shielding filter 17 is pasted on an outer surface of the front cover 12. However, the filter may be pasted on an inner surface of the front cover 12.

As described above, the solar photovoltaic module 10 is configured of: a module plate 19 having the back cover 11, the front cover 12, the module main body 13 and the light shielding filter 17; and the frame 14 attached to the module plate 19.

Figure 3:
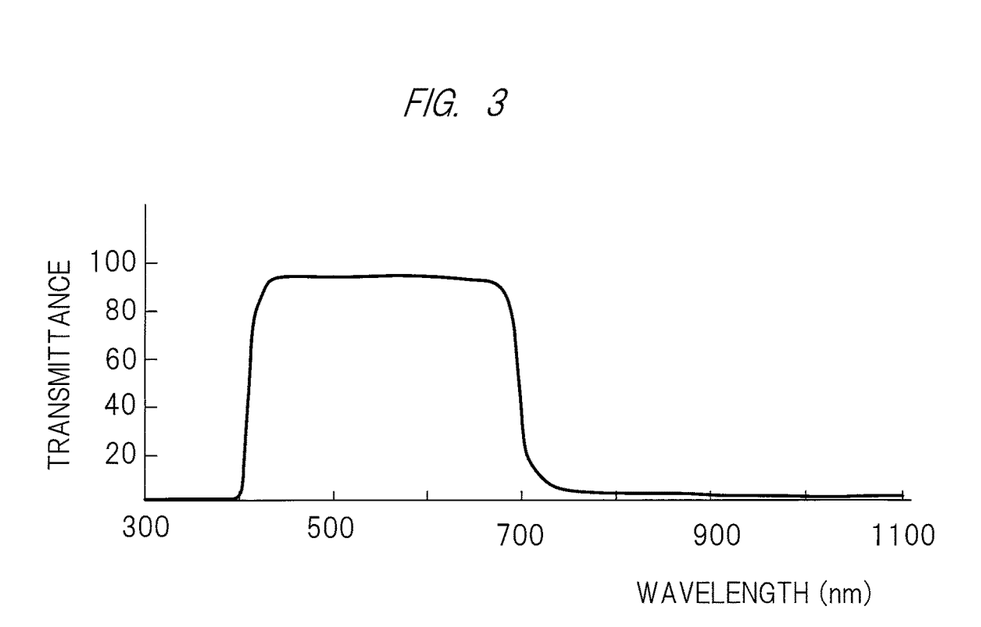
FIG. 3 is a characteristic line diagram showing a relation between a wavelength and a transmittance in a light shielding filter as one example.

FIG. 3 is a characteristic line diagram showing a relation between a wavelength of the light shielding filter 17 as one example and a transmittance. As this light shielding filter 17, a short pass filter produced by CCS Inc., has been used.

As shown in FIG. 3, in the light shielding filter 17, a transmittance of light having a wavelength of 400 nm or shorter, that is, a transmittance of the ultraviolet ray containing a part of light of purple color is almost zero, and a transmittance of light having a wavelength of 700 nm or longer, that is, a transmittance of the infrared ray containing a part of light of red color is almost zero. Almost 100% of the light having the wavelengths of 400 to 700 nm in the visual light is allowed to penetrate the surface of the module main body 13. The light having the wavelengths of 700 to 780 nm in the visual light of the red color is nearly the infrared ray, and tends to increase the surface temperature of the module main body 13. However, as shown in FIG. 3, when the light having the wavelengths of 700 to 780 nm is shielded, the module main body 13 is suppressed from being heated.

By selection of a property of the light shielding filter 17, the light shielding filter having any property of the first to fifth modes as described above can be used. As long as the light shielding filter 17 has the property that shields the light having the above-described specific wavelength, it is unnecessary to paste a sheet-type filter or a belt-type filter on the front cover 12, and a material of the filter may be bonded on the inner surface or the outer surface of the front cover 12 by using a thin film forming method such as a vacuum deposition method and a sputtering method.

FIG. 3 exemplifies the light shielding filter 17 that almost cuts the wavelength of about 700 nm or longer. However, the wavelength that is cut by the light shielding filter 17 may be set in accordance with the property of the solar photovoltaic element.

Figure 4:
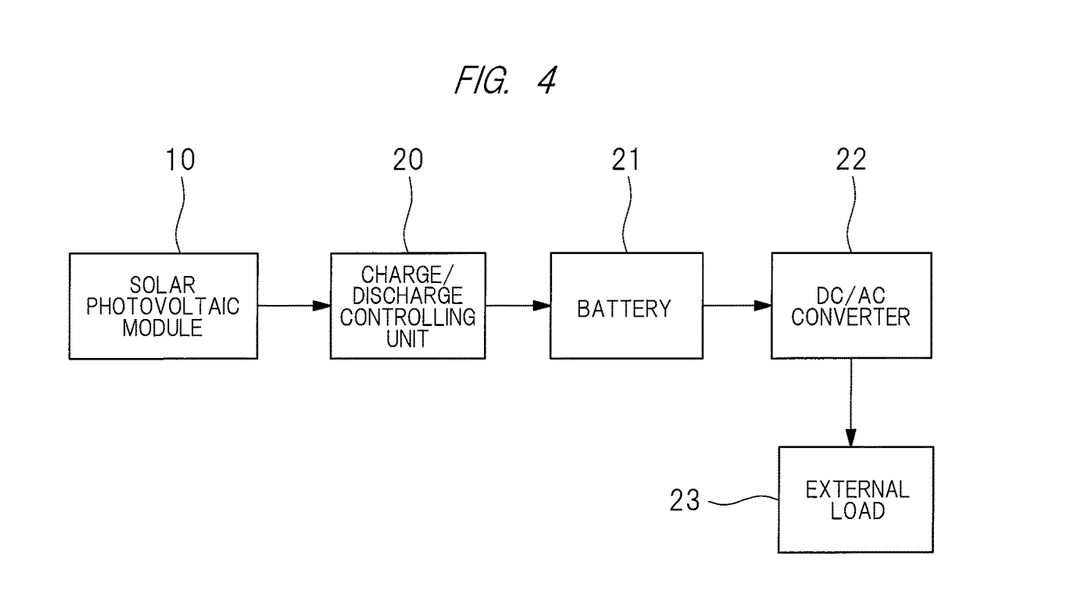
FIG. 4 is a circuit diagram showing a connection state between electric power generated by the solar photovoltaic module and an electric power load.

FIG. 4 is a circuit diagram showing a connection state between an electric power generated by the solar photovoltaic module and an electric power load.

The electric power generated by the solar photovoltaic module 10 is charged in a battery 21 through a charge/discharge controlling unit 20. The charge/discharge controlling unit 20 controls a charged voltage supplied to the battery 21 to prevent overcharge. Further, when the voltage of the batter 21 is low, the charge/discharge controlling unit 20 disconnects a load, and prevents reverse flow. An output from the battery 21 is output to a DC/AC converter 22. This DC/AC converter converts a direct-current voltage, that is output from the battery 21, into commercial electric current and voltage supplied to an external load 23 made of an electric apparatus or others. However, without usage of the battery 21, the electric power may be directly output from the charge/discharge controlling unit 20 to the DC/AC converter 22.

Figure 5:
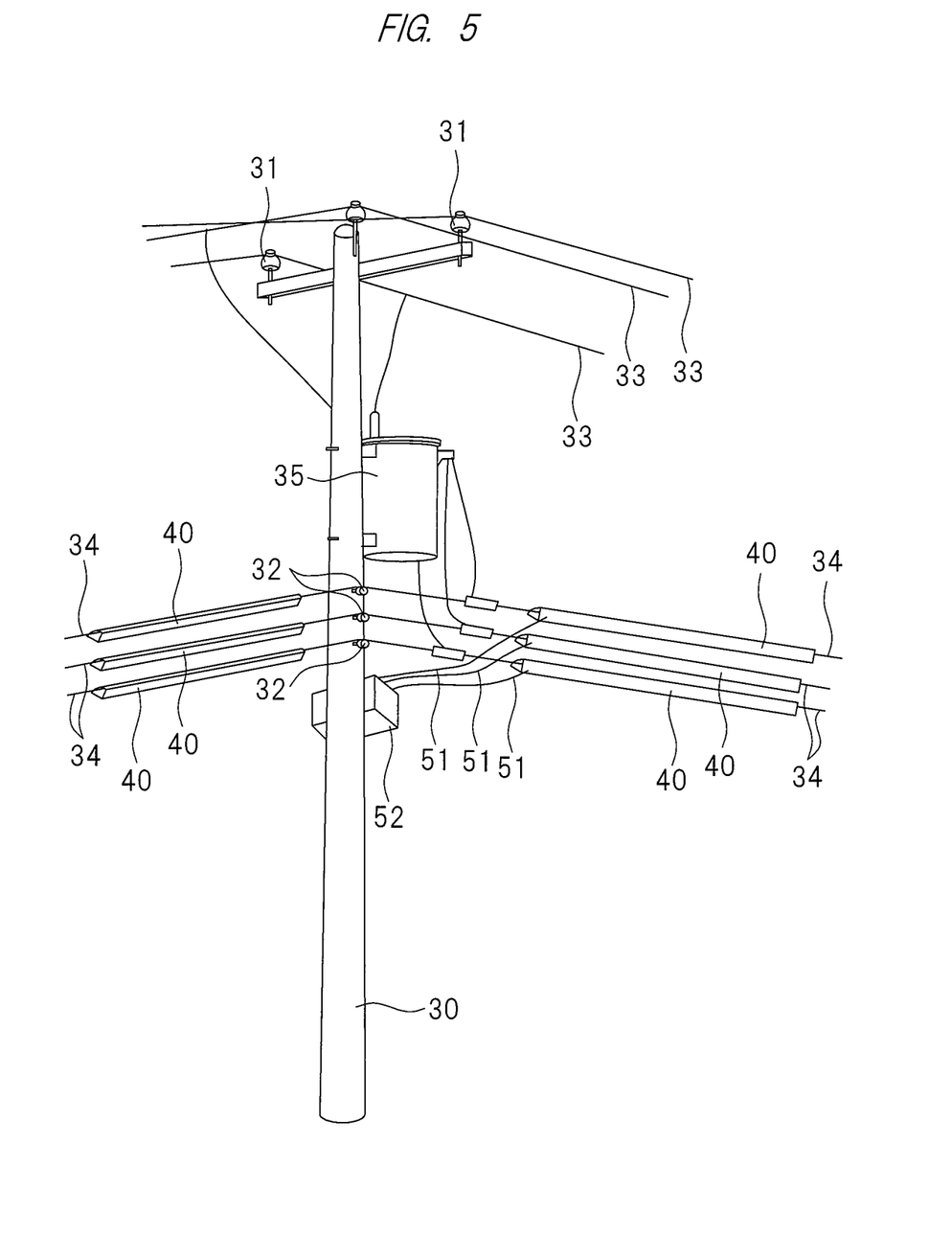
FIG. 5 is a perspective view showing a usage example of a solar photovoltaic module according to another embodiment.
Figure 6:
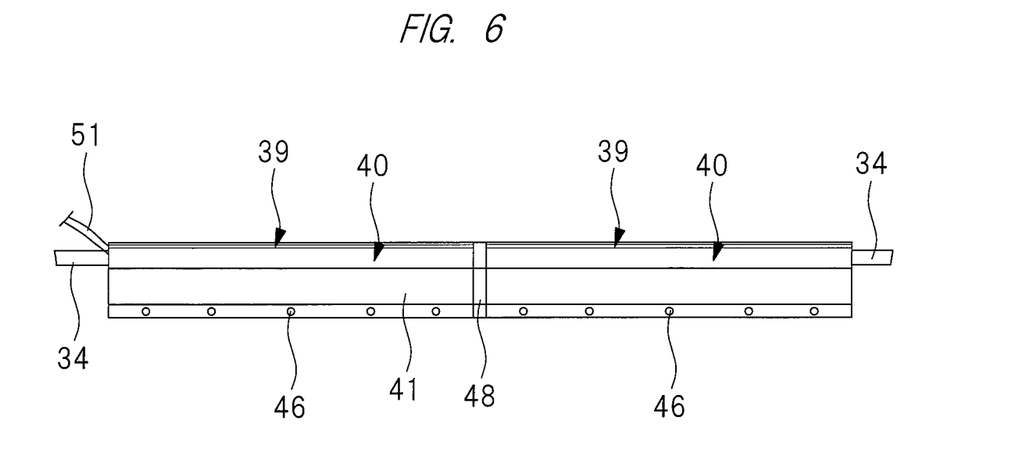
FIG. 6 is a front view of the solar photovoltaic module shown in FIG. 5.
Figure 7:
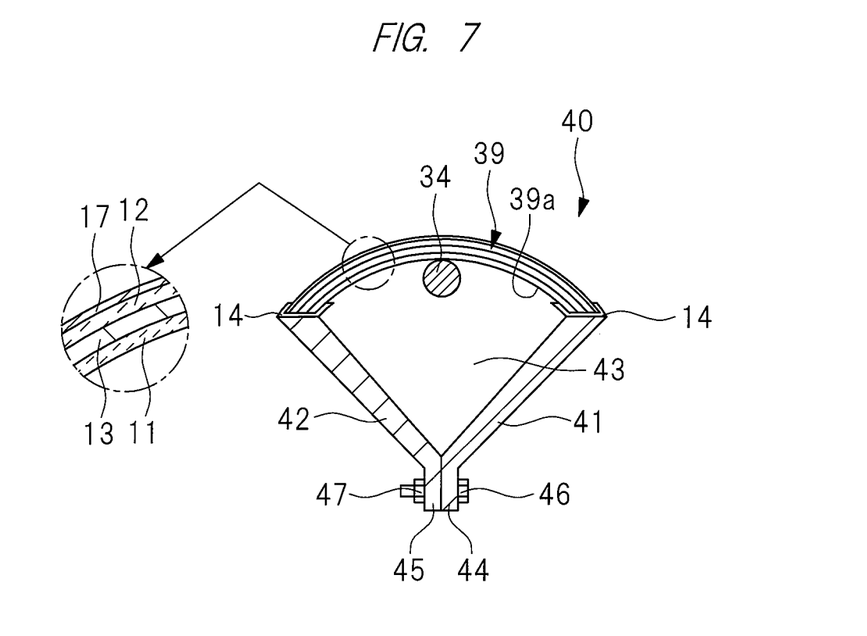
FIG. 7 is a cross-sectional view on a line B-B of FIG. 6.

FIG. 5 is a perspective view showing a usage example of a solar photovoltaic module according to another embodiment. FIG. 6 is a front view of the solar photovoltaic module shown in FIG. 5, and FIG. 7 is a cross-sectional view on a line B-B of FIG. 6.

FIG. 5 shows a utility pole 30, and insulators 31 and 32 are attached to the utility pole 30. A middle-voltage power line 33 is attached to the insulator 31, and a low-voltage power line 34 is attached to the insulator 32. The electric power supplied to the middle-voltage power line 33 is dropped by a transformer 35, and is supplied to the low-voltage power line 34. Each of the power lines 33 and 34 is one cable example, and the cable means an elongated member such as a power line, a wire, a rope, a cable and a laundry pole.

A solar photovoltaic module 40 is mounted on the power line 34. Each solar photovoltaic module 40 has a module plate 39 extending along and arranged on the power line 34 as shown in FIG. 6. As similar to the solar photovoltaic module 10 shown in FIG. 2, the module plate 39 has: a back cover 11 made of a resin, a reinforced glass or others; and a transparent front cover 12 made of a reinforced glass, and the module main body 13 is arranged between the back cover 11 and the front cover 12. The module main body 13 is arranged on an inner surface side of the back cover 11, and the front cover 12 is arranged on a front surface of the module main body 13.

In the manner, the solar photovoltaic module 40 shown in FIG. 6 takes an upper-side arrangement mode in which the module main body 13 is arranged on an upper side of the power line 34.

As different from the solar photovoltaic module 10 shown in FIG. 2, the module plate 39 curves outward along a width direction to have a convex shape, and an inner surface of the module plate 39 is a concave surface.

As shown in FIG. 7, as similar to the solar photovoltaic module 10 shown in FIG. 2, the front cover 12 is provided with the light shielding filter 17. For the light shielding filter 17, any of the first to fifth modes as described above can be selected. A first mode is a type that shields the light having the longer wavelength than the threshold wavelength by using the light shielding filter 17. A second mode is a type that irradiates the module main body with the solar light having a wavelength of 800 nm or shorter while shielding the infrared ray. A third mode is a type that irradiates the module main body 13 with the solar light having a wavelength of 610 nm or shorter while shielding light having a wavelength of a red color or longer. A fourth mode is a type that irradiates the module main body 13 with the solar light having a wavelength of 570 nm or shorter while shielding light having a wavelength of a yellow color or longer. Further, a fifth mode is a type that shields ultraviolet rays having wavelengths of 100 to 400 nm. A short wavelength that is 315 nm or shorter in the ultraviolet rays is not effective for the power generation, and therefore, this type also includes a mode that shields the ultraviolet ray having this wavelength.

When the light shielding filter 17 is arranged in the front cover 12 as described above, the increase in the temperature of the module main body 13 can be suppressed, and the power-generation efficiency can be increased. In FIG. 7, the light shielding filter 17 is pasted on an outer surface of the front cover 12. However, the filter may be pasted on an inner surface of the front cover 12.

The frame 14 is attached to an outer circumference of the module plate 39, and a shielding member that is not illustrated is embedded in the frame 14. A first orientation holding plate 41 is attached on one side of the module plate 39, and a second orientation holding plate 42 is attached on the other side of the module plate 39. Each of the orientation holding plates 41 and 42 is made of an elastically-deformable material such as a resin and a rubber, and is fixed to the frame 14 by an adhesive. A space 43 into which the power line 34 is inserted is formed by the module plate 39 and two orientation holding plates 41 and 42.

Abutting portions 44 and 45 are arranged on lower ends of the orientation holding plates 41 and 42, respectively, and the abutting portions 44 and 45 are fastened by a screw member 46 and a nut 47. In order to mount the solar photovoltaic module 40 on the power line 34, the power line 34 is inserted into the space 43 while the lower ends of the orientation holding plates 41 and 42 are widened so as to form a space between the abutting portions 44 and 45. Next, the abutting portions 44 and 45 are fastened by the screw member 46 and the nut 47. In the manner, the upper side of the power line 34 is covered with the module plate 39, and the lower side thereof is covered with the two orientation holding plates 41 and 42. Further, a center of gravity of the solar photovoltaic module 40 is lower than the power line 34, so that an orientation of the modulate plate 39 is held so that the front surface of the module plate is oriented upward.

In this state, the inner surface of the module plate 39 is the concave surface. Therefore, the module plate 39 is positioned so that the power line 34 is at a center of the module plate 39 in the width direction. Even if the solar photovoltaic module 40 is moved from the position of the power line 34 in the width direction by blow of strong wind against the solar photovoltaic module 40, the solar photovoltaic module 40 is positioned by a weight itself so that the power line 34 is at the center of the module plate 39 in the width direction when the blow of the strong wind stops.

The solar photovoltaic module 40 can have an optional length. When the solar photovoltaic module 40 having a relatively short length is attached to the power line 34 as shown in FIGS. 5 and 6, adjacent solar photovoltaic modules 40 are joined to each other by a joint member 48 as shown in FIG. 6. An output cable 51 is arranged on an end of the connected solar photovoltaic modules 40, and the output cable 51 is connected to a control box 52 attached to the utility pole 30 as shown in FIG. 5.

The charge/discharge controlling unit 20, the battery 21 and the DC/AC converter 22 shown in FIG. 4 are arranged in the control box 52, and the generated electric power of the solar photovoltaic module 40 is output from the DC/AC converter 22 to the power line 34. Note that the output electric power from the solar photovoltaic module 40 may be converted into a commercial voltage frequency and output to the power line 34 without the usage of the battery 21.

The solar photovoltaic module 40 in FIG. 5 is mounted on the low-voltage power line 34. However, this may be mounted on the middle-voltage power line 33. Further, the solar photovoltaic module 40 may be mounted on a high-voltage power line.

Figure 8A:
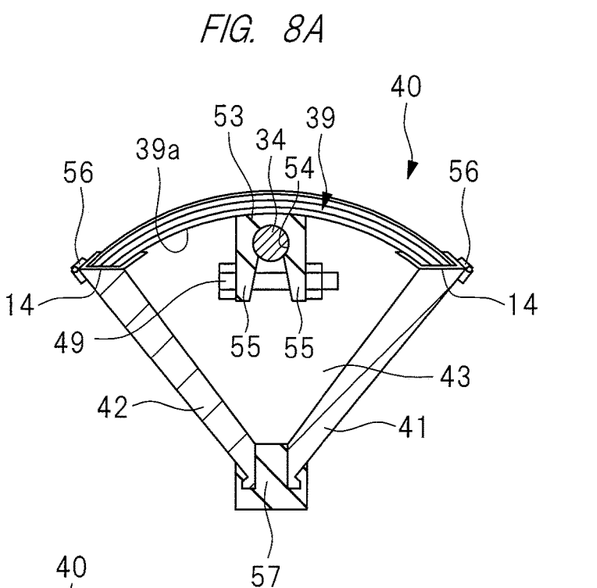
FIG. 8A is a cross-sectional view showing a solar photovoltaic module according to another embodiment.
Figure 8B:
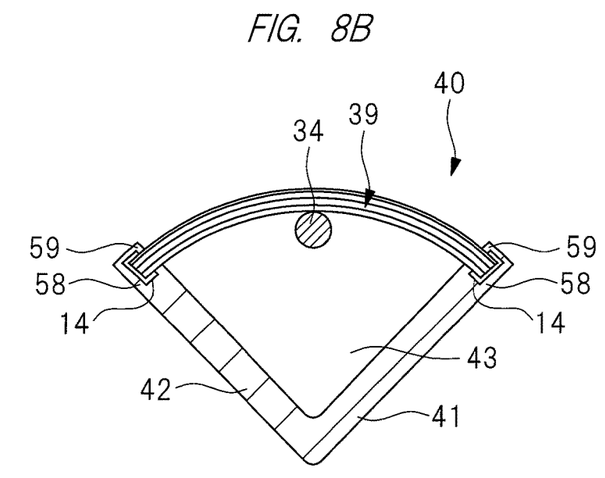
FIG. 8B is a cross-sectional view showing a solar photovoltaic module according to another embodiment.
Figure 8C:
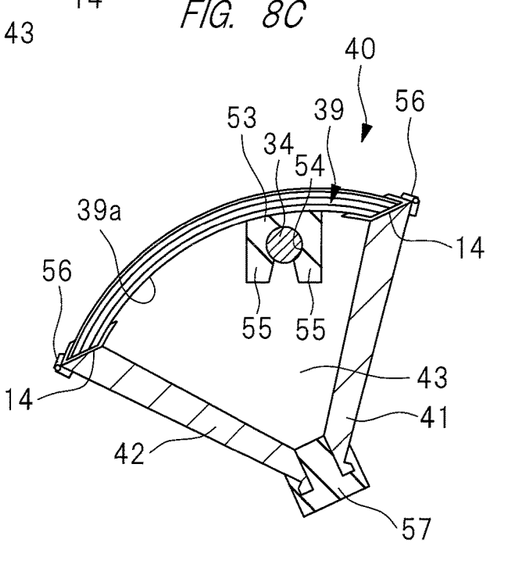
FIG. 8C is a cross-sectional view showing a solar photovoltaic module according to another embodiment.

Each of FIGS. 8A to 8C is a cross-sectional view showing a solar photovoltaic module according to another embodiment. In FIGS. 8A to 8C, members having the above-described commonality will be denoted with the same symbol as one another, and the repetitive description thereof will be omitted.

The solar photovoltaic module 40 in FIG. 8A has the module plate 39, and a structure of this module plate 39 is the same as the structure shown in FIG. 7. On a concave inner surface 39a of the module plate 39, a clamp member 53 is attached at the center of the module plate 39 in the width direction. A concave slot 54 into which the power line 34 is inserted is arranged in the clamp member 53, and elastically-deformable open/closure leg portions 55 extend on an opening side of the concave slot 54. A screw member 49 made of a bolt and a nut is attached to both the leg portions 55. When the screw member 49 is fastened in a state in which the power line 34 is inserted into the concave slot 54, the module plate 39 is tightly fixed to the power line 34. In the manner, the module plate 39 can be fixed to the power line 34 to be oriented to the south so as to have an optional incline angle made from the power line 34.

As described above, the solar photovoltaic module 40 in FIG. 8A is mounted on the power line 34 by the clamp member 53, and the solar photovoltaic module 40 is suppressed from moving even if the strong wind blows against the solar photovoltaic module 40. Particularly, when the module plate 39 is fastened to the power line 34 through the clamp member 53 by the screw member 49, the module plate 39 can be held at the angle at which the module plate is oriented to the south. The clamp member 53 may be attached over a whole length of the module plate 39, or may be attached so that the clamp members are separated from one another at a predetermined gap.

Each of the first orientation holding plate 41 mounted on one side of the module plate 39 and the second orientation holding plate 42 mounted on the other side of the module plate 39 is attached to the frame 14 of the module plate 39 so as to be rotatable by using a hinge 56. The lower ends of the orientation holding plates 41 and 42 are joined to each other by a closure plug 57. Therefore, the solar photovoltaic module 40 is arranged on the power line 34 in a state in which the closure plug 57 is detached from the orientation holding plates 41 and 42. At this time, the power line 34 is inserted into the concave slot 54 of the clamp member 53. Next, when the two orientation holding plates 41 and 42 are joined to each other by the closure plug 57, the mounting of the solar photovoltaic module 40 on the power line 34 ends.

In the solar photovoltaic module 40 shown in FIG. 8B, the two orientation holding plates 41 and 42 are unified with each other. Each of the orientation holding plates 41 and 42 is made of an elastically-deformable material such as a soft rein and a rubber, and a portion engaging the frame 14 of the module plate 39, that is, a tab portion 59 to be stuck with the frame is arranged at the joint portion 58 between the orientation holding plates 41 and 42. In the manner, the structure made of the orientation holding plates 41 and 42 may be a structure in which these two can be freely separated from each other or can be uniformed with each other.

As different from the case shown in FIG. 8A, in the solar photovoltaic module 40 shown in FIG. 8C, the clamp member 53 is arranged so as to be close to one side of the inner surface 39a of the module plate 39 in the width direction. As described above, when the clamp member 53 is arranged so as to be close to one side of the module plate 39 in the width direction, an outer surface of the module plate 39 is not oriented rightly upward but obliquely upward. Therefore, the module plate 39 can be inclined so that the module plate 39 is oriented to the sun. Also when the clamp member 53 is close to one side in the width direction, the leg portions 55 may be fastened by the screw member 49 as shown in FIG. 8A. In this mode of the arrangement of the clamp member 53 to be close to one side, the clamp member may be close to either side.

When the solar photovoltaic module 40 is mounted on a power line as shown in FIG. 5, the solar photovoltaic module 40 can be easily set by using a power line that is an existing facility. Besides, since the power line is placed at a position that is far from the ground, even if the solar photovoltaic module 40 is mounted on the power line, the solar photovoltaic module does not disrupt people's action around it. Further, when the light shielding filter 17 is arranged in the module plate 39, the increase in the temperature of the module main body 13 is suppressed, and the power-generation efficiency and the endurance of the solar photovoltaic module 40 can be improved.

Figure 9A:
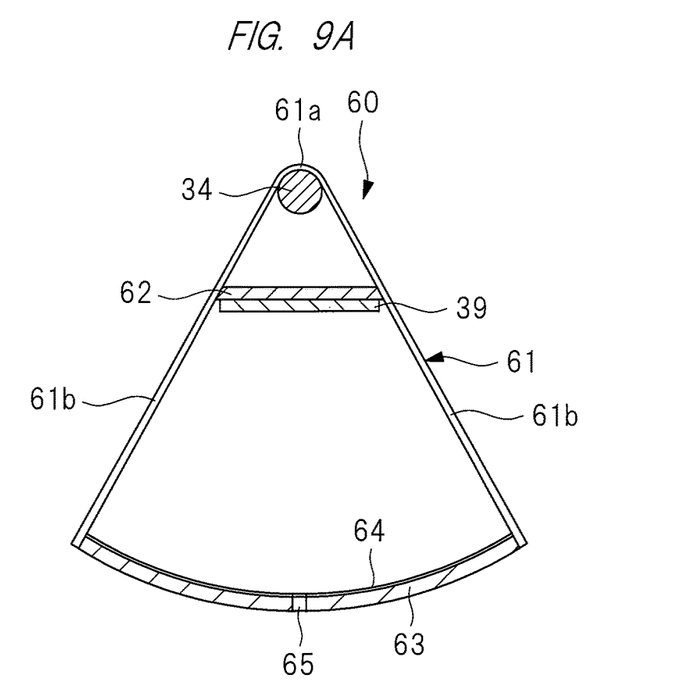
FIG. 9A is a cross-sectional view showing a solar photovoltaic module according to still another embodiment.
Figure 9B:
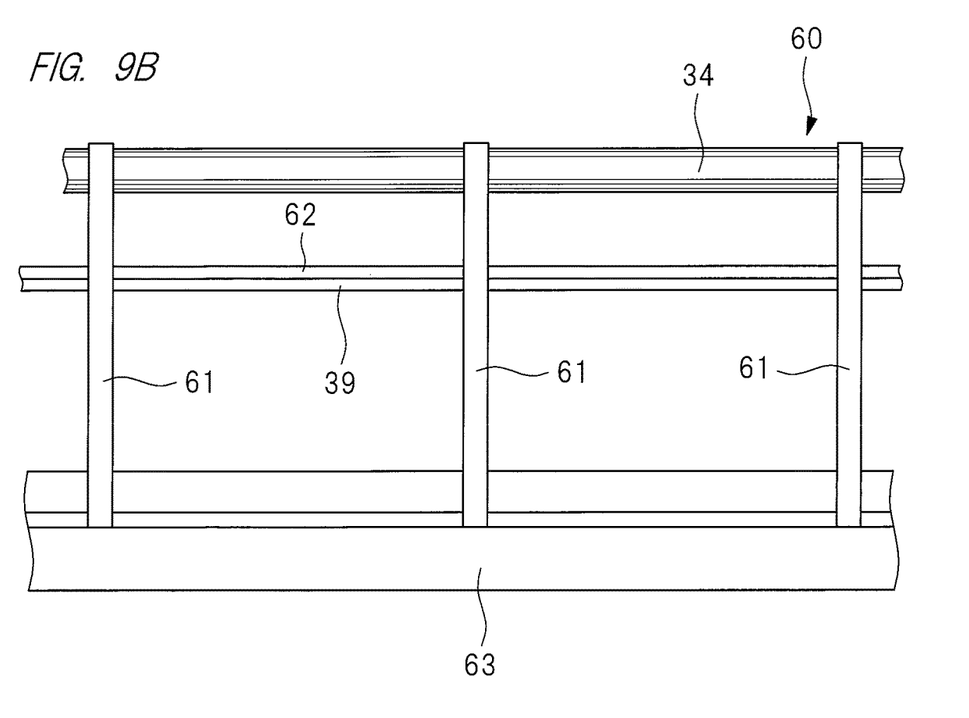
FIG. 9B is a side view of FIG. 9A.

FIG. 9A is a cross-sectional view showing a solar photovoltaic module according to still another embodiment, and FIG. 9B is a side view of FIG. 9A.

This solar photovoltaic module 60 has a belt member 61 serving as a panel supporting member mounted on the power line 34 across the power line 34. The belt member 61 includes an arc-shaped portion 61a arranged on the power line 34 and side piece portions 61b that are continuously uniformed on right and left sides of the arc-shaped portion, and a module attaching plate 62 is attached between the side piece portions 61b on the right and left sides. The module attaching plate 62 extends along the power line 34 and has a predetermined length, and a plurality of belt members 61 are attached to the module attaching plate 62.

A module plate 39 is attached to a lower surface of the module attaching plate 62, and the module plate 39 has a length in accordance with the module attaching plate 62. The module plate 39 includes the back cover 11, the front cover 12 and the module main body 13 arranged between the back cover and the front cover as described above, and the light shielding filter 17 is not arranged in this module plate 39. In the module plate 39, the back cover 11 is attached to the module attaching plate 62, and the front cover 12 is oriented downward.

A reflection plate 63 is attached to a lower end of the belt member 61. The reflection plate 63 has a length in accordance with the module plate 39, and has a concave surface shape that curves in the width direction. A reflection layer 64 is arranged on an inner surface of the reflation plate 63. As shown in FIG. 9A, a lateral cross-sectional surface of the solar photovoltaic module 60 has a triangular shape made of the reflection plate 63 and the right and left side piece portions 61b of the belt member 61, a base side of which is the reflection plate 63. This solar photovoltaic module 60 is a reflection-type solar panel in which the module plate 39 is irradiated with solar light reflected on the reflection plate 63.

As similar to the above-described light shielding filter 17, the reflection layer 64 can take a first mode that does not reflect the solar light having the longer wavelength than the threshold wavelength on the module main body 13 but shields the light. Further, the reflection layer 64 can take the second to fifth modes. That is, as described above, a second mode is a type that reflects the solar light having a wavelength of 800 nm or shorter on the module main body 13 while shielding the infrared ray to irradiate the module main body, and a third mode is a type that reflects the solar light having a wavelength of 610 nm or shorter on the module main body 13 while shielding light having a wavelength of a red color or longer. A fourth mode is a type that reflects the solar light having a wavelength of 570 nm or shorter on the module main body while shielding light having a wavelength of a yellow color or longer, and a fifth mode is a type that shields ultraviolet rays having wavelengths of 100 to 400 nm. A short wavelength that is 315 nm or shorter in the ultraviolet ray is not effective for the power generation, and therefore, this type also includes a mode that shields the ultraviolet ray having this wavelength.

The reflection layer 64 is formed by coating the inner surface of the reflection plate 63 with a paint or a thin film forming method such as a vacuum deposition method or a sputtering method.

A water drain hole 65 is arranged at a center of the reflection plate 63 in a width direction. Even if rain water enters from an upper side of the reflection plate 63, the water drain hole 65 drains the rain water.

Figure 10A:
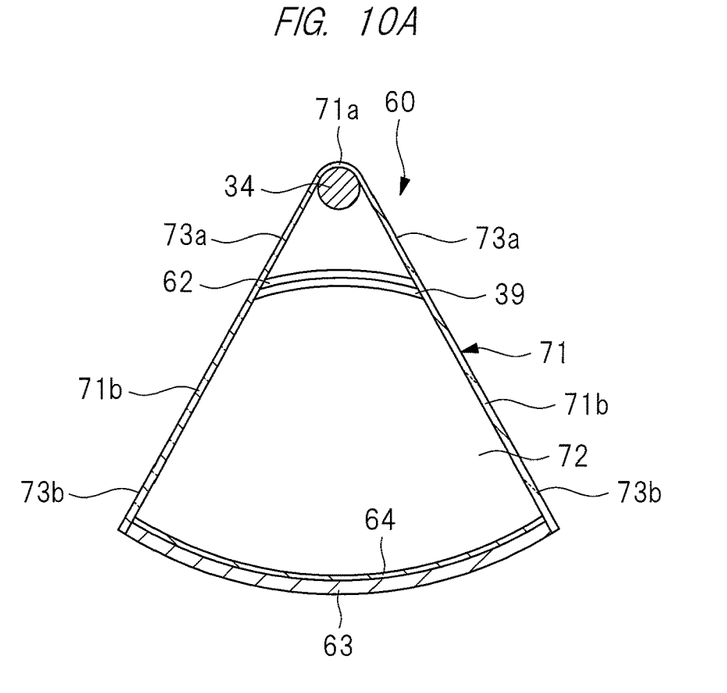
FIG. 10A is a cross-sectional view showing a solar photovoltaic module according to still another embodiment.
Figure 10B:
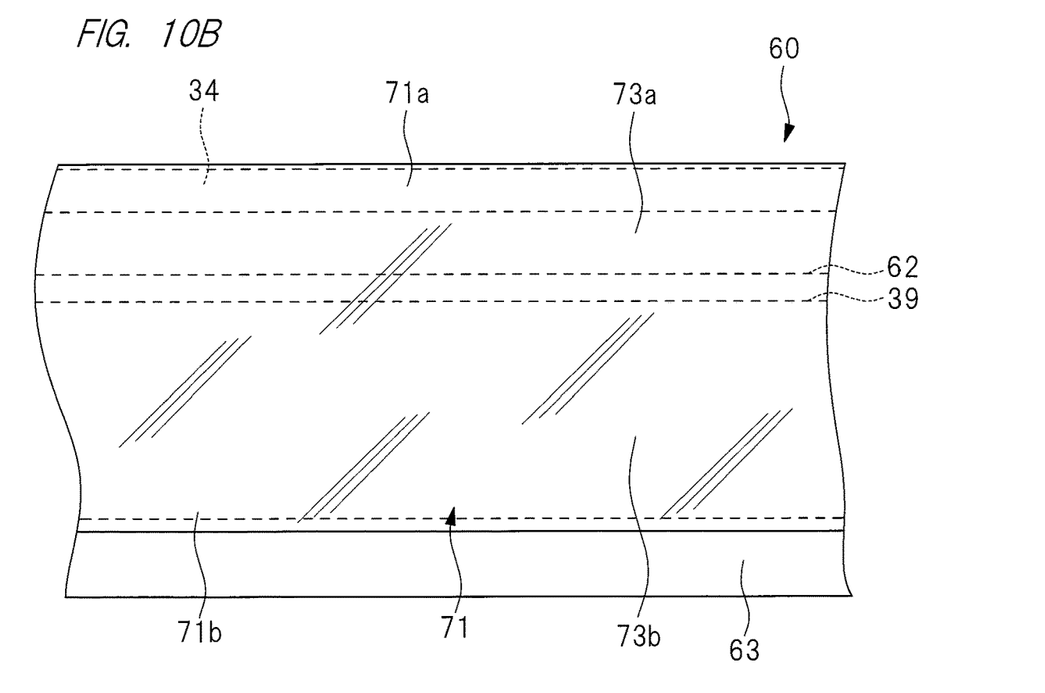
FIG. 10B is a side view of FIG. 10A.

FIG. 10A is a cross-sectional view showing a solar photovoltaic module according to still another embodiment, and FIG. 10B is a side view of FIG. 10A.

This solar photovoltaic module 60 includes a supporting plate 71 serving as a panel supporting member striding across and mounted on the power line 34, and the supporting plate 71 has transparency. The supporting plate 71 includes an arc-shaped portion 71a arranged on the power line 34 and side plate portions 71b that are continuously uniformed on right and left sides of the arc-shaped portion, and has a predetermined length extending along the power line 34. Between the side plate portions 71b on the right and left sides, the module attaching plate 62 is attached. The module attaching plate 62 has a length in accordance with the supporting plate 71.

The module plate 39 is attached to a lower surface of the module attaching plate 62, and the module plate 39 has a length in accordance with the module attaching plate 62. The module plate 39 includes the back cover 11, the front cover 12 and the module main body 13 arranged between the back cover and the front cover as described above. As similar to the module plate 39 shown in FIG. 9, the back cover 11 is attached to the module attaching plate 62, the front cover 12 is oriented downward, and the light shielding filter 17 is not arranged.

The reflection plate 63 is attached to a lower end of a supporting plate 71. The reflection plate 63 has a length in accordance with the module plate 39, and has a concave surface shape that curves in the width direction. The reflection layer 64 is arranged on an inner surface of the reflation plate 63. In the manner, when the panel supporting member is the supporting plate 71 having the transparency, the supporting plate 71 is configured to be transmissive so that the reflection plate 63 can be irradiated with the solar light, and a housing chamber 72 closed by the supporting plate 71 and the reflection plate 63 can be formed. In the manner, the foreign substances and the rain water can be prevented from entering the housing chamber 72. When end plates not illustrated are attached to both ends of the supporting plate 71 and the reflection plate 63, both ends of the housing chamber 72 close.

When an upper portion 73a of each of the side plate portions 71b than the module plate 39 in FIG. 10 is set to a reflection surface, increase in an inner temperature near the power line 34 can be suppressed. The reflection surface can be formed by pasting a reflection plate on the upper portion 73a of the supporting plate 71. In the mode of setting the upper portion 73a to the reflection surface, the upper portion 73a is set to the reflection plate while a lower portion 73b of the side plate portion 71b is set to a transparent plate, so that the upper portion 73a and the lower portion 73b can be also different members from each other.

Alternatively, the housing chamber 72 surrounded by the lower portion 73b, the module attaching plate 62 and the reflection plate 63 may be evacuated to be in a vacuum state, or be encapsulated with gas having low thermal conductivity.

As shown in FIG. 10A, the solar photovoltaic module 60 has a triangular shape made of the reflection plate 63 and the right and left side plate portions 71b of the supporting plate 71, a base side of which is the reflection plate 63. This solar photovoltaic module 60 is a reflection-type solar panel in which the module plate 39 is irradiated with solar light reflected on the reflection plate 63. Besides, the modulate plate 39 can be attached inside the closed housing chamber 72.

Each of the module attaching plate 62 and the module plate 39 shown in FIG. 10A has a concave surface shape that curves in the width direction so that a surface facing the reflection plate 63 is a concave surface. As similar to that shown in FIG. 9, for the reflection layer 64 arranged on the inner surface of the reflection plate 63, any property of the first to the fifth modes can be selected. Further, a member that reflects the ultraviolet ray but does not allow the ultraviolet ray to transmit therethrough may be arranged on at least any one of a lower surface of the module plate 39 shown in FIG. 10A, an upper surface of the reflection plate 63 shown in FIG. 10A, and either of an inner or outer surface of the side plate portion 71b.

Figure 11:
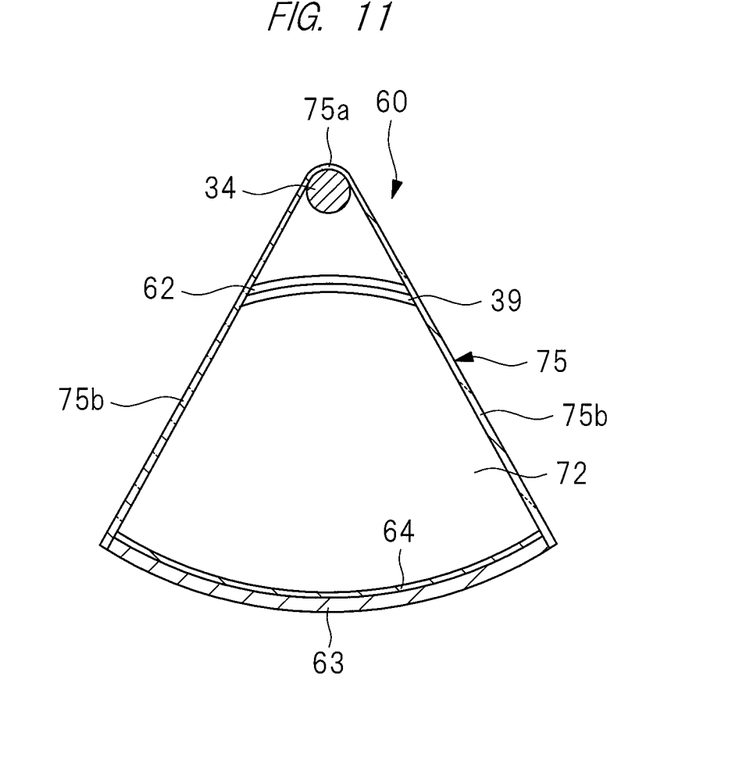
FIG. 11 is a cross-sectional view showing a solar photovoltaic module according to still another embodiment.

FIG. 11 is a cross-sectional view showing a solar photovoltaic module according to still another embodiment. In this solar photovoltaic module 60, the panel supporting member is made of a filter plate 75 having transparency. The filter plate 75 includes an arc-shaped portion 75a arranged on the power line 34 and side plate portions 75b that are continuously uniformed on right and left sides of the arc-shaped portion. A module attaching plate 62 is attached to the filter plate 75, and a module plate 39 is attached to a lower surface of the module attaching plate 62. As similar to that shown in FIG. 10, the module plate 39 includes the back cover 11, the front cover 12 and the module main body 13 arranged between the back cover and the front cover as described above, and the front cover 12 is oriented downward.

The reflection plate 63 is arranged on a lower end of the filter plate 75. As similar to the above-described light shielding filter 17, a property type of the filter plate 75 can take a first mode that shields the solar light having the longer wavelength than the threshold wavelength so that the light having the wavelength does not reach the reflection layer 64. Further, the filter plate 75 can take the above-described second to fifth modes. That is, as described above, a second mode is a type that irradiates the reflection layer 64 with the solar light having a wavelength of 800 nm or shorter while shielding the infrared ray, and a third mode is a type that irradiates the reflection layer 64 with the solar light having a wavelength of 610 nm or shorter while shielding light having a wavelength of a red color or longer to reflect the light to the module main body 13. A fourth mode is a type that irradiates the reflection layer 64 with the solar light having a wavelength of 570 nm or shorter while shielding light having a wavelength of a yellow color or longer to reflect the light to the module main body 13, and a fifth mode is a type that shields ultraviolet rays having wavelengths of 100 to 400 nm. A short wavelength that is 315 nm or shorter in the ultraviolet rays is not effective for the power generation, and therefore, this type also includes a mode that shields the ultraviolet ray having this wavelength.

When the light having the wavelength that is not effective for the power generation is removed by the filter plate 75 while the module main body 13 is irradiated with the light having the specific wavelength as described above, the reflection layer 64 can reflect the entire light having the wavelengths that have transmitted the filter plate 75 to the module main body 13.

On the other hand, when the reflection layer 64 of the reflection plate 63 is configured to reflect only the light having the specific wavelength but shield the light having other wavelength, any one of the above-described first to fifth modes can be set in accordance with combination of the filter plate 75 and the reflection layer 64.

Therefore, also in the solar photovoltaic module 60 shown in FIG. 10A, a member having the same filter property as that of the filter plate 75 of the solar photovoltaic module 60 shown in FIG. 11 may be arranged on any one of the upper surface of the reflection plate 63, the entire and only the lower portion of the side plate portion 71b.

Each of the solar photovoltaic modules 40 and 60 shown in FIGS. 7 to 11 is illustrated in the mounting case on the power line 34. However, the mounting is not performed only on the power line 34, and the modules may be mounted on another cable such as a rope and a laundry pole.

The present invention is not limited to the foregoing embodiments and various modifications can be made within the scope of the present invention.

A solar photovoltaic module of the present invention is applied to a technique that converts energy of solar light into electric power.

What is claimed is:

1. A solar photovoltaic module comprising:
a module plate that is made of a module main body having a solar photovoltaic element, and a front cover arranged on a front surface side of the module main body, the module plate curving outward along a width direction to have a convex shape and having an inner surface being a concave surface, the module plate being arranged over and along a cable;
a first orientation holding plate that is mounted on one side of the module plate; and
a second orientation holding plate that is mounted on the other side of the module plate, that is connected to the first orientation holding plate, that forms a space in which the cable penetrates, together with the first orientation holding plate and the module plate,
wherein the first orientation holding plate and the second orientation holding plate hold the module plate so as to be oriented upward.

2. The solar photovoltaic module according to claim 1, wherein the front cover is provided with a light shielding filter that shields light having a longer wavelength than a wavelength of light having an equivalent energy to a level of an energy band gap of a semiconductor configuring the solar photovoltaic element but transmits light having a shorter wavelength than that toward the module main body.

3. The solar photovoltaic module according to claim 1, wherein the front cover is provided with a light shielding filter that irradiates the module main body with solar light having a wavelength of 800 nm or shorter while shielding the infrared ray.

4. The solar photovoltaic module according to claim 3, wherein the light shielding filter allows the module main body to be irradiated with solar light having a wavelength of 610 nm or shorter while shielding light having a wavelength of a red color or longer.

5. The solar photovoltaic module according to claim 3, wherein the light shielding filter allows the module main body to be irradiated with solar light having a wavelength of 570 nm or shorter while shielding light having a wavelength of a yellow color or longer.

6. The solar photovoltaic module according to claim 3, wherein the light shielding filter shields ultraviolet rays having wavelengths of 100 to 400 nm.

7. The solar photovoltaic module according to claim 1, wherein the module plate is in contact with the cable, and the module plate is positioned by the first orientation holding plate and the second orientation holding plate so that the cable is at a center of the module plate in the width direction.

8. The solar photovoltaic module according to claim 1, further comprising
a clamp member having a concave slot into which the cable is inserted and mounted on an inner surface of the module plate.

9. The solar photovoltaic module according to claim 8, further comprising
a screw member formed in the clamp member and fastening the clamp member to the cable.

* * * * *